(12) United States Patent
Han et al.

(10) Patent No.: US 6,960,509 B1
(45) Date of Patent: Nov. 1, 2005

(54) METHOD OF FABRICATING THREE DIMENSIONAL GATE STRUCTURE USING OXYGEN DIFFUSION

(75) Inventors: Sang-In Han, Phoenix, AZ (US); Kurt W. Eisenbeiser, Tempe, AZ (US); Bing Lu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/883,182

(22) Filed: Jun. 30, 2004

(51) Int. Cl.[7] .................. H01L 21/84; H01L 21/338; H01L 21/336
(52) U.S. Cl. .................. 438/283; 438/157; 438/176
(58) Field of Search .................. 438/157, 176, 438/283

(56) References Cited

U.S. PATENT DOCUMENTS

| 6,355,532 | B1 * | 3/2002 | Seliskar et al. | 438/283 |
| 6,413,802 | B1 * | 7/2002 | Hu et al. | 438/151 |
| 6,642,090 | B1 * | 11/2003 | Fried et al. | 438/164 |
| 6,765,303 | B1 * | 7/2004 | Krivokapic et al. | 257/25 |
| 6,812,119 | B1 * | 11/2004 | Ahmed et al. | 438/585 |
| 6,844,238 | B2 * | 1/2005 | Yeo et al. | 438/424 |
| 2004/0108523 | A1 * | 6/2004 | Chen et al. | 257/202 |
| 2004/0266076 | A1 * | 12/2004 | Doris et al. | 438/157 |

* cited by examiner

Primary Examiner—Jennifer M. Kennedy
(74) Attorney, Agent, or Firm—Ingrassia, Fisher & Lorenz, P.C.

(57) ABSTRACT

The present invention provides a method of fabricating a silicon fin useful in preparing FinFET type semiconductor structures. The method is particularly useful for creating fins with a width and smoothness appropriate for sub-50 nm type gates. The method begins with a silicon fin prepared by lithographic means from an SOI type structure such that the fin is larger in dimension, particularly width, than is desired in the final fin. If desired the silicon fin can include a nitride cap. A conformal diffusion layer, such as of silicon dioxide, is then deposited onto the fin and silicon dioxide substrate. A PECVD deposition using TEOS gas is one method to deposit the diffusion layer. The coated fin is then heated and exposed to oxygen. The oxygen diffuses through the diffusion layer and converts a portion of the silicon material to silicon dioxide. This oxidation continues until a desired amount of silicon material is converted to $SiO_2$ such that the remaining silicon has the desired dimensions. The silicon fin is then exposed through wet etching steps that remove the silicon dioxide coating.

30 Claims, 2 Drawing Sheets

METHOD OF FABRICATING THREE DIMENSIONAL GATE STRUCTURE USING OXYGEN DIFFUSION

FIELD OF THE INVENTION

The present invention relates to a method of forming very thin fins for use on FinFET devices. The present invention more particularly relates to deposition of a diffusion layer on a predeposited silicon fin to act as a controlling agent in the oxidation of silicon to $SiO_2$. The diffusion of oxygen through the diffusion layer yields a silicon fin with thin walls, desired dimensions, and good mechanical strength.

BACKGROUND OF THE INVENTION

Metal Oxide Semiconductor Field Effect Transistors (MOSFETs) have found a wide application as electronic devices. They find significant use, for example, in digital processing applications. MOSFETS, like other transistor devices, continue to be scaled to smaller and smaller dimensions in order to improve integrated circuit performance and cost. As the MOSFET device is further miniaturized, however, it becomes increasingly difficult to maintain high performance characteristics. It also becomes increasingly technically challenging to fabricate the MOSFET features in the needed smaller dimensions.

The double gate MOSFET is considered an attractive device to succeed the planar MOSFET structure. With two gates controlling the channel, short-channel effects can be advantageously controlled. The FinFET structure, a kind of semiconductor such as a double gate MOSFET structure, consists of a channel formed in a vertical silicon fin that is controlled by a double gate. It is anticipated that the FinFET design will find good application in the technology node where gate length is approximately 45 to 50 nm, and correspondingly the desired silicon fin width will be approximately half, on the order of 20 nm. In the design and fabrication of FinFET devices it is desired to create a very tall and thin silicon structure. The measurement of such a structure may be characterized by its aspect ratio which is the height/width. An aspect ratio of 4 to 5 would be desired in some examples.

Previously the formation of thin fin structures (approximately 20 nm in width) from an SOI (semiconductor on insulator) structure has been problematic. In the first place the width of the fin structure is beyond the resolution limit or capabilities using the lithographic techniques currently available. Thus, fabrication methods different from the standard lithographic technique must be utilized. These other techniques, generally involving forming a larger silicon structure than desired for the final size, and then trimming the structure dimension through various means to the desired measure, have drawbacks that render them unacceptable.

One such method of trimming oversize silicon fins involves an RIE (reactive ion etch) technique to trim down the silicon fin from its originally overdefined size. This method, however, is limited by manufacturing considerations to creating fins that are not less than approximately 30 nm in width. Thus, the technique is not viable for technology nodes going below that dimension. RIE is also an undesirable technique in that it generates fin structures with surface roughness. Surface roughness leads to poor electrical performance in the finished transistor. Further, RIE methods have poor dimensional control in the wafer method of manufacture; this drawback results in nonuniformity between transistors at different points on a wafer. Thus, RIE is an undesirable method of manufacturing.

Another possible technique is the thinning of a silicon fin through oxidation of the fin structure followed by removal of the $SiO_2$ that results during oxidation. Prior art methods have taught that one can decrease the width of a silicon fin by exposing the fin to oxygen at a reaction promoting temperature. The oxygen thereupon oxidizes the silicon and converts to silicon dioxide. (The silicon dioxide is later removed using other methods such as wet etching.) However, there is an inherent drawback to this process that renders this method undesirable. The process promotes weakness at the point where the silicon fin meets the silicon dioxide substrate layer, the base portion of the fin. This arises by virtue of the fact that there is stress at the interface between the silicon fin structure and the underlying silicon dioxide layer. Upon exposure to oxygen, this stress promotes a preferential reaction of the silicon in the stressed interfacial region with oxygen. Thus there tends to be a greater level of reaction of silicon in the base area. This phenomenon is called necking in view of the problem that arises in the base region where the fin contacts the $SiO_2$ substrate layer. Necking results in a mechanical weakening of the fin; and this weakness leads to problems during the subsequent processing steps that take place in industrial fabrication methods. Further, the narrowing of the fin affects the electrical characteristics of the fin. Hence a pure oxidation is an unattractive method for shaping a fin to a desired dimension.

Still, a timed oxidation is much more controllable than a timed ion etch. Oxidation processes are well characterized and widely practiced in chip manufacturing. Oxidation steps usually do not suffer from the chip-to-chip variability that occurs with a plasma etch process. Thus, it would be desirable to find a fabrication method that takes advantage of the controllability aspect of the oxidation process while eliminating its disadvantages.

Hence there is a need to develop a new method for the fabrication of thin fin structures of silicon. It would be desired that the method yield improved results over prior art methods. It is desired that the resulting fins demonstrate good physical integrity and electrical properties. Further it would be desired that the method be adaptable to present MOSFET processing techniques and apparatus and that it be relatively inexpensive to use. It would further be advantageous if the new method employed existing processing hardware and equipment that is used in semiconductor manufacturing processes. The present invention addresses one or more of these needs.

BRIEF DESCRIPTION OF THE DRAWINGS

The present invention will hereinafter be described in conjunction with the following drawings, wherein like numerals denote like elements, and wherein.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

It has now been discovered that an additional process step or steps can be added during the fabrication of fin structures to avoid the above-mentioned prior art shortcomings and limitations. A diffusion layer of, for example, silicon dioxide is deposited around an oversized silicon fin. Oxygen is then allowed to diffuse through the diffusion layer, to the silicon fin, whereupon the oxygen reacts with the silicon to form silicon dioxide. Control of parameters such as the time and temperature of oxidation, and of the thickness of the diffusion layer on the sidewall of a fin structure, affects the degree of oxidation that takes place. Proper shaping of the diffusion layer further avoids the necking phenomenon that occurs in the subsequent oxidation step. The silicon fin that is developed by the inclusion of this processing step displays improved electrical and mechanical properties over prior art fins. Other independent features and advantages of the method of fabricating a three dimensional gate structure such as a silicon fin will become apparent from the following detailed description, taken in conjunction with the accompanying drawings which illustrate, by way of example, the principles of the invention.

Figure 1:
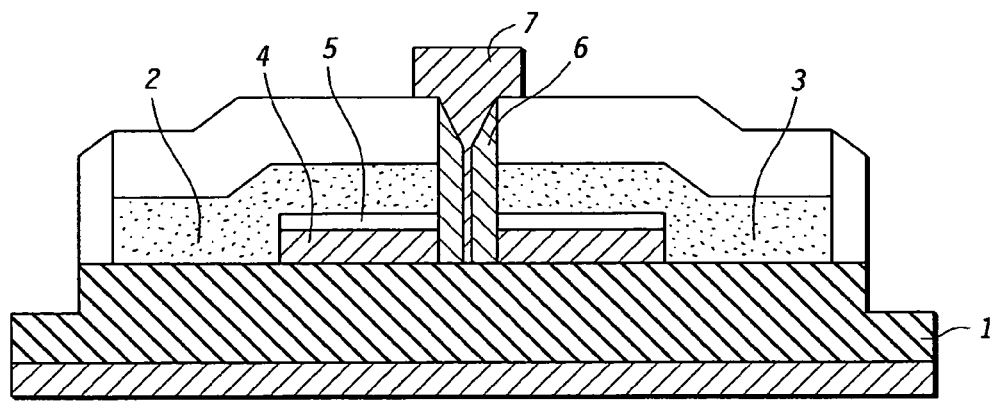
FIG. 1 is a schematic view of FinFET type structure.

Referring now to FIG. 1 there is shown a schematic diagram of an exemplary FinFET type structure. The structure includes an oxide layer 1, a source 2, drain 3, silicon fin 4, silicon dioxide hard layer 5, nitride spacer 6, and gate 7. The following discussion is directed to steps useful in the creation of silicon fin 4. As described in, for example, U.S. Pat. No. 6,413,802 a fin structure is first created from a multilayer structure of, for example, a buried oxide, a silicon layer, and a hardmask layer. Lithographic techniques can be used to remove materials so as to expose a preliminary fin structure. At this stage, the fin structure is typically oversized from that desired in the final fin. The processing steps described further herein can yield a fin of dimension smaller than that previously known such that the fin will be suitable for use wherein the gate length is on the order of 20 nm.

Figure 2:
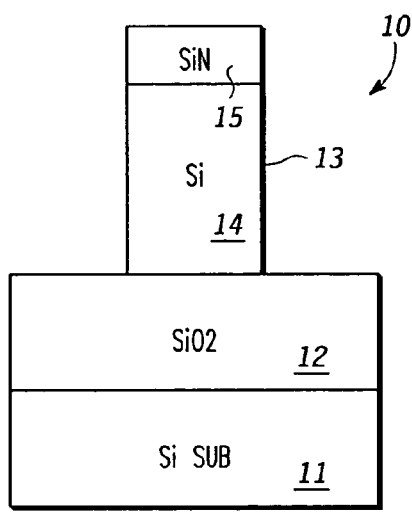
FIG. 2 is a schematic view of an SOI with a nitride cap structure according to an embodiment of the present invention.

In a first step of the method an SOI structure is created. Referring now to FIG. 2 there is shown an SOI structure 10 (semiconductor-on-insulator) that may be further processed to yield a desired fin structure, which in turn can be used in manufacturing a finished transistor device. A silicon substrate layer 11 is at one end of the structure. Disposed above the silicon substrate layer is an insulation layer 12. Silicon dioxide ($SiO_2$) is a typical dielectric material for insulation layer 12. Rising from insulation layer 12 is fin 13. Fin 13 comprises a body portion 14 and a cap 15. Preferably body 14 is composed of silicon, and cap 15 is composed of silicon nitride ($Si_3N_4$). The SOI structure 10 may be fabricated during preliminary steps using known fabrication techniques such as optical lithography with pattern transfer. In one preferred embodiment, the originally fabricated silicon fin is approximately 40 to approximately 60 nm in width.

It is the objective of the method described herein to create a final structure with preferred gate dimensions. The preferred dimensions in one embodiment are those that are acceptable for the semiconductor generation with gate length of approximately 50 nm. Thus, in one embodiment it will ultimately be desired that the final fin have a target width of approximately 20 nm. It is acceptable to construct a fin width of approximately 15 nm to approximately 25 nm, more preferably still of approximately 18 nm to approximately 22 nm. It is therefore desired in one embodiment to create the original SOI structure 10 such that fin 13 has a width of approximately 50 nm. Width of approximately 40 nm to approximately 60 nm is acceptable. Further, any fin can be created where the original fin is wider than the final fin width. Additionally it is preferred that body 14 should have a thickness of approximately 100 nm and cap a thickness of approximately 20 nm, though other dimensions are possible. Thus the total thickness of fin 13 is approximately 120 nm. The dimension of fin 13 as it extends into the page and out of the page is not shown. The dimension is any that may be used in semiconductor applications.

Figure 3:
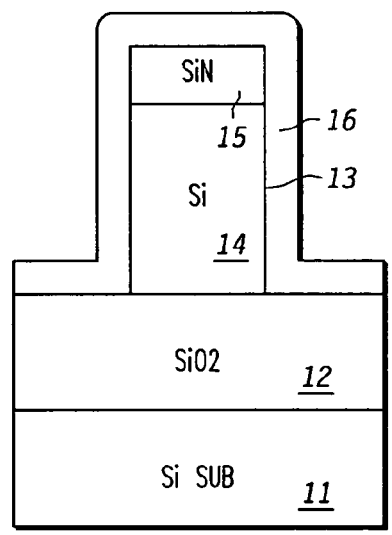
FIG. 3 is a schematic view of a silicon fin and nitride cap with a covering diffusion layer according to an embodiment of the present invention.

Following creation of the SOI structure 10, a conformal diffusion layer is deposited around fin 13 and on insulator 12. The result of this step is shown in FIG. 3. The newly deposited diffusion layer 16 preferably comprises silicon dioxide. As shown diffusion layer 16 envelops fin 13 and provides an additional layer of silicon dioxide on top of insulation layer 12. Diffusion layer 16 is a conformal layer in that the thickness of the coating is approximately uniform in all directions. Thus, at the conclusion of depositing the diffusion layer the thickness of diffusion layer 16 is approximately equivalent as measured normal to the sides of fin 13 and as measured normal from the surface of insulation layer 12. In a preferred embodiment, the thickness of diffusion layer 16 is approximately 300 angstroms, though other dimensions are possible. It is further preferred to deposit a conformal diffusion layer that is approximately 250 to approximately 350 angstroms in depth.

The preferred method of depositing diffusion layer 16 utilizes plasma enhanced chemical vapor deposition (PECVD). The method further includes use of tetraethoxysilane (TEOS) as a source of oxygen and silicon. TEOS deposition preferably occurs at temperatures of approximately 250° C. to approximately 400° C.

The next step in the process is a diffusion and oxidation step. The coated SOI structure is exposed to oxygen ($O_2$) at elevated temperature. The oxygen thereupon diffuses through the diffusion layer 16 that has coated the SOI structure 10. Upon reaching the body 14, which is composed of silicon, the oxygen reacts with the silicon therein. However, the oxygen does not react with silicon nitride in cap 15. Nor does oxygen reach other layers such as the substrate layer 11 during the diffusion step. As the oxygen reacts with silicon in body 13 these materials convert to silicon dioxide, which is the material in the diffusion layer 16 and insulation layer 12. The temperature during this step is a temperature sufficient to promote diffusion of the oxygen to the fin and reaction of the oxygen with the fin material. Likewise the time is a time sufficient, at the chosen temperature, to promote diffusion of the oxygen and reaction with the fin material.

In a preferred embodiment, the diffusion and oxidation step takes place upon a rack of semiconductor wafers held in a quartz vessel. The quartz vessel is gradually heated to an elevated temperature of between approximately 800° C. to approximately 1100° C. In a preferred embodiment, 1100° C. was chosen for an oxidation temperature. Heating can take place by placing the quartz vessel in a heating oven, or by applying a heating means such as heating coils to the vessel. It is preferred that the oxygen admitted into the quartz vessel be dry. However, it is also possible to perform the diffusion and oxidation step when water vapor is present with the oxygen. Diffusion (and oxidation) is a time and temperature sensitive operation. Thus, the time allowed for the step is dependent on the temperature of the materials, as well as the thickness of the diffusion layer 16. Generally the diffusion and oxidation step can take place in a time of from approximately one minute to approximately an hour, assuming the materials are at desired temperatures.

Figure 4:
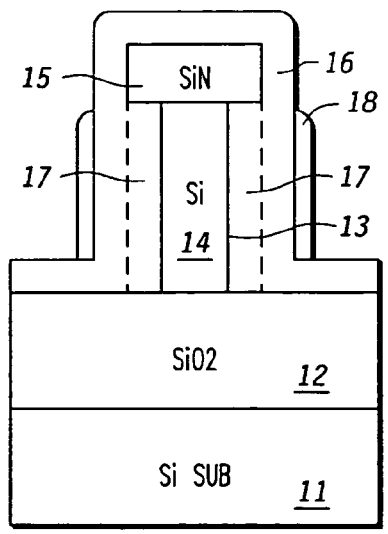
FIG. 4 is a schematic view of a silicon fin and nitride cap with a covering diffusion layer showing changes in the silicon fin after oxidation according to an embodiment of the present invention.

Referring now to FIG. 4 there is shown a depiction of the modified structure as it exists at the conclusion of the diffusion and oxidation step. In physical terms, body 14 of fin 13 has shrunk in width. Whereas in FIG. 1 the body 14 was approximately 50 nm thick, now the body is approximately 20 nm thick. Approximately 15 nm of material from body 14 has now been removed (converted) from either side. This removed material is shown as shadow region 17 on either side of body 14. Cap 15 retains its original dimensions. The silicon material of body 14 that was previously present in shadow region 17 has been converted to silicon dioxide, the same material as was present in diffusion layer 16 (where that material comprises diffusion layer 16). Originally the $SiO_2$ in diffusion layer 16 is not as pure as $SiO_2$ grown by thermal oxidation of Si because it contains small amounts of hydrogen. However, it becomes pure $SiO_2$ because of hydrogen evolution during the oxidation process at high temperature. Thus it is that the material in shadow region 17 is now the same as, and is integrated with, diffusion layer 16. FIG. 4 also illustrates diffusion layer 16 as now having a bulge 18. Bulge 18 illustrates the volume increase that occurs by converting silicon in body 14 to silicon dioxide. The silicon dioxide has a greater volume than the original silicon. Thus it is that upon microanalysis, diffusion layer 16 will expand upon completion of the diffusion and oxidation step as compared to its dimension before the step.

A qualitative discussion of the diffusion and oxidation step illustrates a further control aspect of the step. The diffusion and oxidation step may have the added benefit of smoothing out the walls of body 14. The methods employed to create the SOI structure of FIG. 1, for example, often create a fin 13 and body 14 with unevenness on the exterior portion. This unevenness is undesired as it affects electron flow through the skin layer of fin 13, and thus affects the electronic performance of fin 13 in semiconductor applications. It has been discovered, however, that oxidation of body 14, controlled by diffusion of oxygen through diffusion layer 16, may smoothe out the unevenness that was previously present in body 14. The diffusion path through diffusion layer tends to promote oxygen reaction with silicon without bulges or unevenness. The smooth body 14 thus may demonstrate improved electronic performance.

Figure 5:
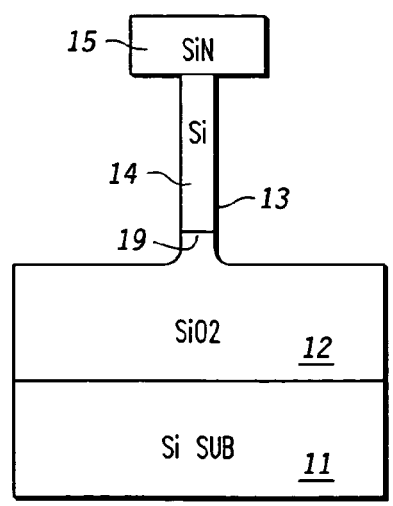
FIG. 5 is a schematic view of a silicon fin with nitride cap after removal of the diffusion layer according to an embodiment of the present invention.

Following the diffusion and oxidation step is a step or a series of steps to expose body 14 and place it in condition for further semiconductor processing. In a first step, silicon dioxide is removed through a wet etching step. Referring now to FIG. 5 there is shown how the structure may appear following the wet etching. Diffusion layer 16 has been removed. Additionally, a portion of insulation layer 12 (also silicon dioxide) has also been removed. Thus, body 14 now projects off insulation layer 12 from a pedestal portion 19.

In a preferred embodiment, the reactants in the wet etching react with silicon dioxide but not with silicon nitride. Thus cap 15 remains. A preferred wet etching to remove silicon dioxide material is an HF (hydro fluoric) acid diluted 1:20 with de-ionized water.

Figure 6:
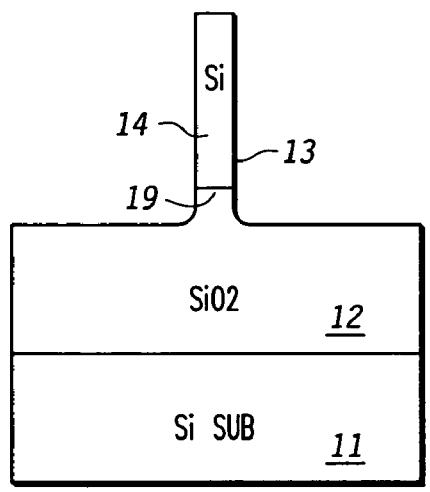
FIG. 6 is a schematic view of a finished silicon fin after removal of a silicon nitride cap according to an embodiment of the present invention.

As shown in FIG. 6, the silicon nitride cap 15 is removed by a further wet etching step. Treatment with hot phosphoric acid, for example, is one procedure that will remove a silicon nitride cap. What remains in FIG. 6 is a fin with desired dimensions. The fin is now approximately 20 nm thick and approximately 100 nm in height. This results in an aspect ratio (height/width) of approximately 5.0. It is desired to create fin bodies with an aspect ratio of between approximately 4.0 and approximately 5.0.

At this point in the process there may follow further processing and deposition steps as needed to create a finished semiconductor. For example the silicon fin may receive a further deposit of metal oxide as needed for gate formation.

A conformal diffusion layer is advantageous to the overall method of achieving a thin fin structure. The fact of depositing a conformal layer of, for example, $SiO_2$ on the surfaces is important in the oxygen diffusion that subsequently takes place. Diffusion layer 16 creates a layer through which oxygen must first pass during an oxidation step, and thus creates a path for an individual oxygen molecule. The depth of diffusion layer 16 affects the diffusion path, and this may be used to control the diffusion and oxidation step. The travel path of the oxygen acts to protect the base of the silicon fin, the portion that is weakened in prior art procedures. By creating a conformal diffusion layer, the diffusion path length toward the basal area of the fin becomes longer than the diffusion path length to other points, points on fin body 14 and on insulation layer 12. As a consequence of a longer diffusion path length, the degree of diffusion and oxidation of the basal fin area is less than at other points. Thus, in effect, the oxygen preferentially diffuses to and reacts with points on the fin surface at points removed from the fin/substrate contact. Moreover, the basal area of the fin tends to be thicker than other cross sections of the pin as illustrated in the photomicrograph shown in FIG. 7. Thus, the diffusion layer, by controlling diffusion and oxidation, avoids the previously encountered problem of necking.

The oxidation reaction may be controlled by the diffusion process. Thus, as discussed, it is preferred to protect the potentially weak basal area where the fin contacts the $SiO_2$ substrate, which is accomplished by depositing a conformal diffusion layer that in effect creates a longer diffusion path for $O_2$ molecules to reach the fin base. However, in a similar manner, the diffusion layer could be used to protect other areas of the fin, if desired. If, for example, it is desired to limit oxidation of other areas of the fin, areas other than the basal area, an extra amount of material can be deposited in the diffusion layer, which by creating a longer diffusion path will thus limit the amount of oxidation that takes place on the silicon fin. The shape and amount of material in the diffusion layer can thus be used to shape or engineer desired features on the underlying silicon material.

In the previous discussion the diffusion layer has been described as preferably constructed of $SiO_2$. However, other materials may also be used to comprise the diffusion layer. Any layer which allows diffusion of oxygen ($O_2$), and that has the necessary properties that allow deposition of the material, and then removal of the material, may be used as a material for the diffusion layer. Preferably the diffusion layer should allow for a controlled diffusion rate of oxygen. Other materials that may be used as the diffusion layer include silicon oxy nitride (SiON), including silicon oxy nitrides of all various compositions and stoichiometries with silicon, oxygen, and nitrogen, metal oxides, metals, or metal silicides.

As previously described, the fin was created with a finished width (of the purely silicon material) of approximately 20 nm. It should be understood, however, that different widths are possible. The dimensions of the silicon fin can be adjusted by initially defining larger or smaller silicon fins and then oxidizing more or less silicon material. The dimension of 20 nm is described, however, as this fits a MOSFET technology node. MOSFETS can be categorized as falling into technology nodes depending on various physical or performance characteristics. Gate dimension is one way of describing a grouping of MOSFETS in a technology node. Generally, the desired thickness of the fin is targeted as approximately half the gate length. Thus, a 20 nm thick fin would be well suited to a MOSFET with a gate length of approximately twice that dimension. A 20 nm thick silicon fin is therefore applicable to a gate that is approximately 45 nm in length.

In the described examples, a thickness of approximately 15 nm was removed from each side of the original fin structure. It is possible to remove more or less than this material depending on the variables described above. It is preferred, however, in some embodiments to remove no more than approximately 75% of the width of the original fin. This percentage is a guide that conforms to good control of the process.

Figure 7:
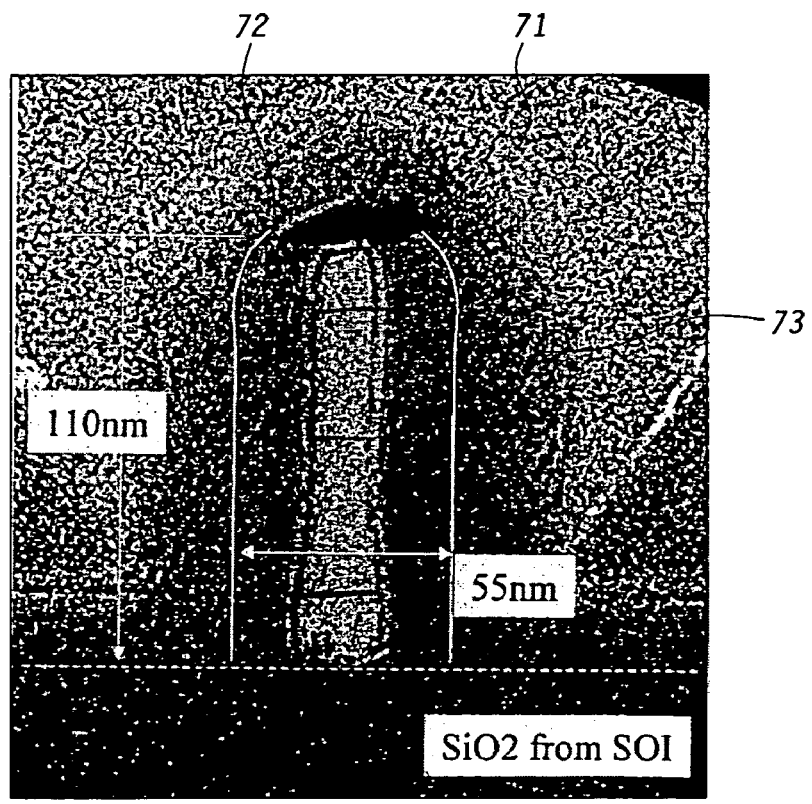
FIG. 7 is a photomicrograph of a silicon fin according to an embodiment of the present invention.

Referring now to FIG. 7 there is shown a photomicrograph of a representative fin cross section fabricated according to the method described above. The structure shows a fin after the diffusion and oxidation step has taken place, but before removal of the diffusion layer or the cap. The photomicrograph displays a fin body 71 with a cap 72 in place. Diffusion layer 73 is present as a darker area around fin body 71. The walls of fin are smooth. The fin displays no necking; rather, as described above, the basal area of the fin is slightly larger in width than the upper body area (the body area moving away from the substrate and toward the cap). The height of the fin is approximately 110 nm. The width of the fin at the base is approximately 21 nm, as measured at a—a. At the middle of the body (b—b), and in the area of the cap (c—c), the fin width is approximately 15 nm. This is characteristic of the fin structure after diffusion/oxidation; a basal width is slightly greater than a mid-section or upper section width. The diffusion layer and cap can be removed by etching techniques so that the silicon fin is exposed.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for creating a semiconductor fin comprising the steps of:
    providing a semiconductor fin on an insulated substrate structure;
    depositing a diffusion layer over the semiconductor fin; and
    exposing the diffusion layer-covered fin to oxygen under conditions sufficient to allow diffusion of the oxygen to the semiconductor fin and reaction of the oxygen with the semiconductor fin.

2. The method according to claim 1 wherein the semiconductor fin comprises a silicon fin.

3. The method according to claim 1 wherein the insulated substrate structure comprises silicon dioxide.

4. The method according to claim 1 wherein the diffusion layer comprises silicon dioxide.

5. The method according to claim 1 wherein the diffusion layer comprises silicon oxy nitride.

6. The method according to claim 1 wherein the diffusion layer comprises a metal oxide, metal or metal silicide.

7. The method according to claim 1 wherein the step of exposing the diffusion layer further comprises exposing at a temperature of between approximately 800° C. to approximately 1100° C.

8. The method according to claim 1 wherein the step of exposing the diffusion layer further comprises exposing for a time of between approximately 1 minute to approximately 60 minutes.

9. The method according to claim 1 further comprising the step of removing the diffusion layer through a wet etching.

10. A method for creating a semiconductor fin useful for FinFET applications comprising the steps of:
    providing a fin comprising a semiconductor body and a silicon nitride cap wherein the width of the fin is wider than desired in the finished fin, and wherein the fin is disposed on a silicon dioxide layer;
    depositing a conformal diffusion layer over the fin and over a portion of the silicon dioxide layer;
    exposing the covered fin and silicon dioxide layer to oxygen and a temperature and for a time to promote diffusion of the oxygen to the fin and reaction of the oxygen with the fin;
    removing silicon dioxide material through a wet etching; and
    removing silicon nitride cap material through an etching.

11. The method according to claim 10 wherein the semiconductor body comprises silicon.

12. The method according to claim 10 further comprising reacting the semiconductor fin with oxygen thereby decreasing the size of the fin to a desired amount.

13. The method according to claim 10 wherein the width of the fin after reaction with oxygen is between about 15 nm to about 25 nm.

14. The method according to claim 10 wherein the width of the fin after reaction with oxygen is between about 18 to about 22 nm.

15. The method according to claim 10 wherein the fin has an aspect ratio of approximately 4 to approximately 5.

16. The method according to clam 10 wherein the width of the silicon body that is originally provided is between about 40 nm to about 60 nm.

17. The method according to claim 10 wherein the diffusion layer comprises silicon dioxide.

18. The method according to claim 10 wherein the deposited conformal diffusion layer is between about 275 to about 325 angstroms in thickness.

19. The method according to claim 10 wherein the diffusion layer is deposited through use of TEOS gas.

20. The method according to claim 18 wherein the diffusion layer is deposited through use of a PECVD using TEOS gas at a temperature of between about 250° C. to about 400° C.

21. A method for forming silicon fins on a wafer comprising a silicon layer and a silicon dioxide layer comprising the steps of:
- removing silicon material on the wafer to expose a silicon fin on a silicon dioxide substrate wherein the fin has a width greater than desired in the finished fin;
- depositing a diffusion layer over the fin and silicon dioxide substrate;
- placing the wafers in a vessel;
- heating the vessel;
- passing oxygen through the vessel;
- oxidizing silicon material in the fin thereby converting a portion of the fin material to silicon dioxide; and
- removing the diffusion layer and the silicon dioxide thereby exposing the remaining silicon fin.

22. The method according to claim 21 wherein the step of removing silicon comprises a lithographic process and an etch process.

23. The method according to claim 21 further comprising the step of placing the vessel in a heating oven.

24. The method according to claim 21 wherein the vessel comprises a quartz tube.

25. The method according to claim 21 wherein the step of depositing a diffusion layer comprises depositing a layer of silicon dioxide through a PECVD deposition technique using tetraethylorthosilicate gas as the source of silicon dioxide.

26. The method according to claim 21 wherein the diffusion layer comprises silicon dioxide.

27. The method according to claim 21 wherein the step of heating the vessel further comprises heating the vessel to a temperature of between approximately 800° C. to approximately 1100° C.

28. The method according to claim 21 wherein the diffusion layer comprises a conformal diffusion layer with depth of between about 250 to about 350 angstroms.

29. The method according to claim 21 wherein the step of removing the diffusion layer further comprises removing by use of a wet etching method.

30. The method according to claim 21 wherein the step of oxidizing further comprises oxidizing for a time of between about 1 minute to about 60 minutes.

* * * * *